United States Patent [19]

Olver

[11] Patent Number: 4,862,116
[45] Date of Patent: Aug. 29, 1989

[54] ACTIVE PHASE AND AMPLITUDE MODULATOR

[75] Inventor: Terence E. Olver, Baltimore, Md.

[73] Assignee: The United States of America as represented by the Secretary of the Navy, Washington, D.C.

[21] Appl. No.: 262,380

[22] Filed: Oct. 17, 1988

[51] Int. Cl.[4] .......................... H03C 3/00; H03C 3/40
[52] U.S. Cl. ............................ 332/23 R; 332/16 R; 332/23 A; 332/24
[58] Field of Search ..................... 332/16 R, 16 T, 17, 332/22, 23 R, 23 A, 24, 31 T, 40, 41, 42, 43 R, 48, 49; 455/305

[56] References Cited

PUBLICATIONS

Kumar, M. et al, "Broad-Band Active Phase Shifter Using Dual-Gate MESFET", *IEEE Transactions on Microwave Theory and Techniques*, vol. MTT-29, No. 10, Oct. 1981, pp. 1098-1102.

Primary Examiner—David Mis
Attorney, Agent, or Firm—Adams: Robert W.

[57] ABSTRACT

An active phase and amplitude modulator separates an input carrier into four phases. The phases are amplified and modulated separately. Summing circuits combine the phases into a single resultant output.

2 Claims, 3 Drawing Sheets

ACTIVE PHASE AND AMPLITUDE MODULATOR

BACKGROUND OF THE INVENTION

Modulators are an essential part of adaptive signal cancellers. The function of a modulator is to provide a signal exactly in amplitude but 180 degrees out of phase with an unwanted signal existing in the canceller circuit. The result is that the unwanted signal is nulled out and cancelled. Unwanted signals may be, for example, signals from a nearby transmitter coupled into the input circuits of a receiver, or distortion causing signals in transmitter circuits.

In fulfilling its function the modulator accepts as an input a carrier signal which it proceeds to vary in amplitude and phase, under control of a modulating signal. The variation in amplitude is over a range from zero to some maximum value and in phase from 0 degrees to 360 degrees. Also, to minimize the generation of other unwanted signals, the distortion content of the modulated carrier signals at the modulator output must be kept low. The distortion products produced by the modulator are grouped around harmonics of the carrier signal and consist of harmonics of the carrier and modulating sidebands plus intermodulating products between all these signals. Adaptive cancellers are important to the operation of the feed forward cancellation circuits used to linearize high frequency transmitters. Modulators that can independently vary the amplitude and phase of a carrier perform this function by combining together two signals in phase quadrature. This is shown in FIG. 1 where $V(x)$ and $V(y)$ represent the amplitudes of two signals formed in quadrature from the carrier. These are combined together to yield a resultant $V(r)$. By independently varying the amplitude of the two signals $V(x)$ and $V(y)$, the amplitude of the resultant $V(r)$ can be varied from zero to a maximum, and the phase from 0 degrees to 90 degrees, that is within the quadrant bounded by $V(x)$ and $V(y)$. However by reversing the polarity of either or both $V(x)$ and $V(y)$, the phase of the resultant can be made to assume a value in the other 3 quadrants and, of course, the amplitude can be varied as before. Typically, control of the amplitude and sign of either of the two components $V(x)$ and $V(y)$ has been by reflection within a hybrid. For this purpose a quadrature hybrid is most convenient. As shown in FIG. 2 the carrier amplitude V is fed into port 1 and the output appears at port 4. The amplitude of the output can be varied between V and $-V$ by varying the value R, of the two equal resistors terminating ports 2 and 3. With $R=Z(0)$ the characteristics impedance of the hybrid, all he power incident on port 1 is absorbed by the two terminating resistors at ports 2 and 3 and the output at port 4 is zero. With $R=0$ all the power is reflected from ports 2 and 3 to port 4 with a phase $-90$ degrees with respect to the input carrier (neglecting the insertion phase of the hybrid) and an amplitude V. With $R=$ infinity, again all the power is reflected from ports 2 and 3 to port 4 but with a phase $-270$ degrees. The amplitude of this signal is also V as before but with a phase difference of $-180$ degrees compared to the previous phase condition, so it is now denoted by "V. By varying R between 0 and infinity the amplitude of the output signal may be varied between the limits V through 0 to $-V$. In effect, the combination of the hybrid and the variable resistors forms an amplitude modulator. A quadrature hybrid is the most convenient reflective device as equal resistors can be used at ports 2 and 3. An ordinary hybrid requires different resistors at these two ports to produce the same effect.

With two such amplitude modulators and an extra quadrature hybrid to provide two signals in phase quadrature a complete phase and amplitude modulator can be constructed as shown in FIG. 3. Quadrature combination is used with amplitude modulation of quadrature components $V(r)$ #1 and $V(r)$ #2 and the resultant modulated signal can be varied in phase from 0 degrees to 360 degrees and in amplitude 0 to V.

In common practice, the combination of a pair of variable resistors and a reflective hybrid has formed the heart of all modulators. The variable resistors have been provided by a collection of diode-resistor branches which are turned on or off sequentially to gradually adjust the network resistance. The resistors in each branch provide incremental adjustment of the resistance of the network, as their companion diodes are turned completely on or off. Between these resistance steps the resistance of the network is continuously adjusted by varying the current through the branch that is partially on.

This method suffers from two disadvantages. First the diode-resistor branch that is partially on generates a high level of harmonic distortion. To reduce distortion, more branches with more diodes can be added, in effect sharing signal power between more diodes. However, this increases circuit complexity.

Second, as a result of stepping through a number of diode-resistor branches to reach a particular value of network resistance, a number of diodes are turned on. Each diode generates distortion as it turns on and this results in a sequence of bursts of distortion being generated.

Accordingly, it is one object of this invention to provide a phase and amplitude modulator which does not involve the use of noisy diode-resistor networks.

It is a further object of this invention to provide a modulator that is of efficient and non-complex design.

SUMMARY OF THE INVENTION

These and other objects are obtained by replacing the variable resistor-reflective hybrid modulators with four amplifiers each amplifying one quarter of the input carrier, but with a phase that is in quadrature with two of the other amplifiers. One phase of the four phases of the quadrant is supplied to each amplifier input. A quadrature hybrid divides the input carrier into two outputs and differentially phase shifts the two outputs by 90 degrees. These outputs are in turn divided in two by 180 degrees hybrids. Four phases of the carrier are thus available to drive the amplifiers. The gain of each amplifier is controlled by an independent modulating signal (MV). The outputs of all four amplifiers are summed together. The phase and amplitude of the resulting output is dependent on the contribution of each of the amplifiers. No more than two amplifiers need be in use at the same time. As a further refinement each amplifier consists of a push-pull pair of FET amplifiers, providing cancellation of even order distortion products. Control of the gain of each of the four amplifiers is exerted by varying the gate bias voltage of each pair of FETS.

DETAILED DESCRIPTION OF THE PREFERRED EMBODIMENT

Figure 1:
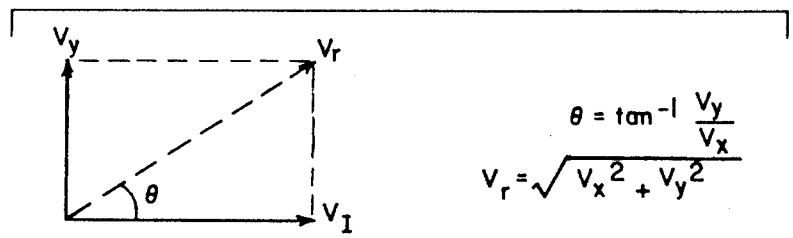
FIG. 1 is a drawing illustrating the combination of two signals in phase quadrature to form a resultant signal.
Figure 2:
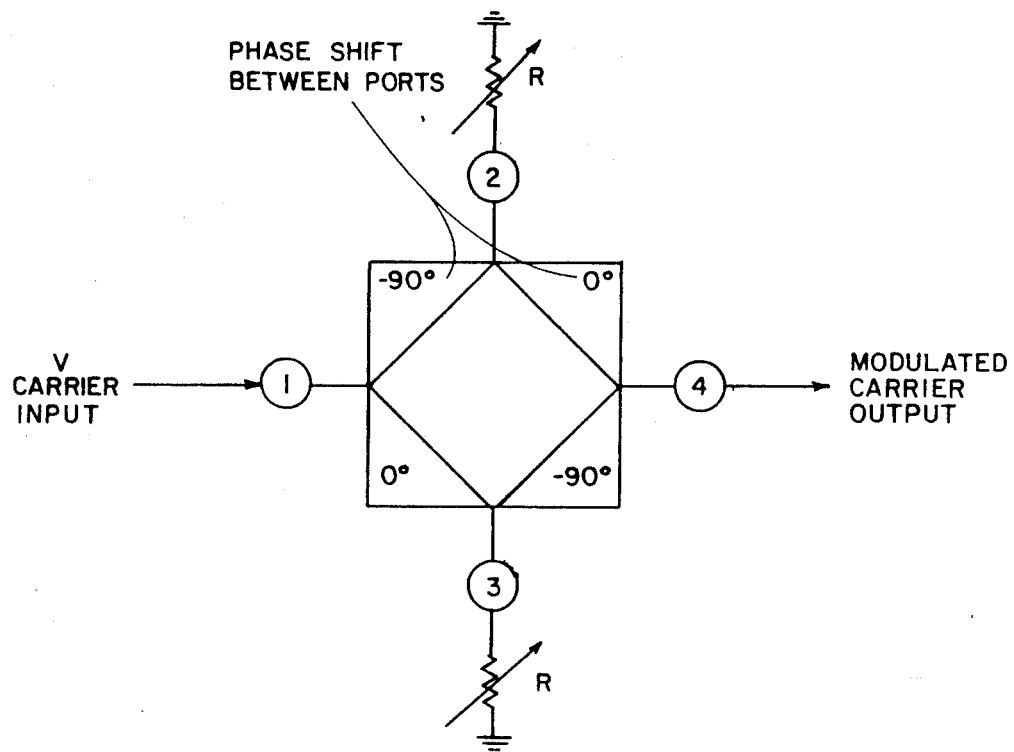
FIG. 2 is a functional diagram of a quadrature hybrid.
Figure 3:
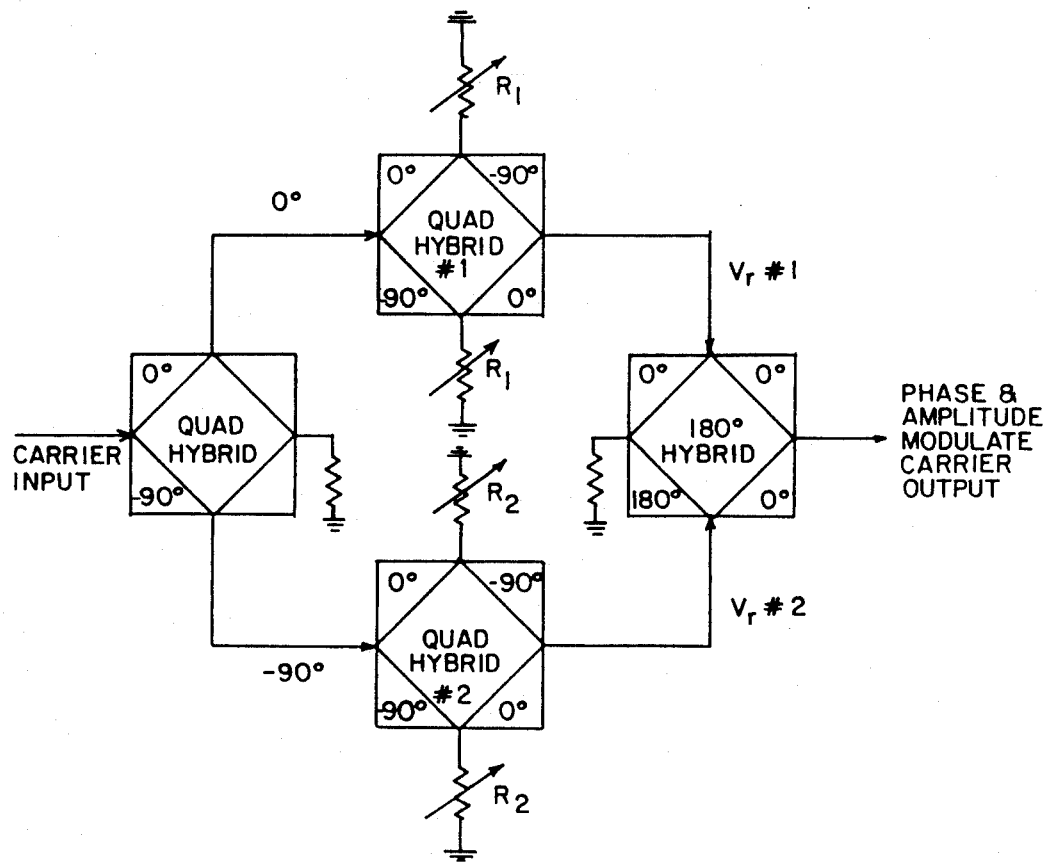
FIG. 3 is a schematic of a PRIOR ART hybrid modulator using diode-resistor networks, indicated on the drawing as variable resistances.
Figure 4:
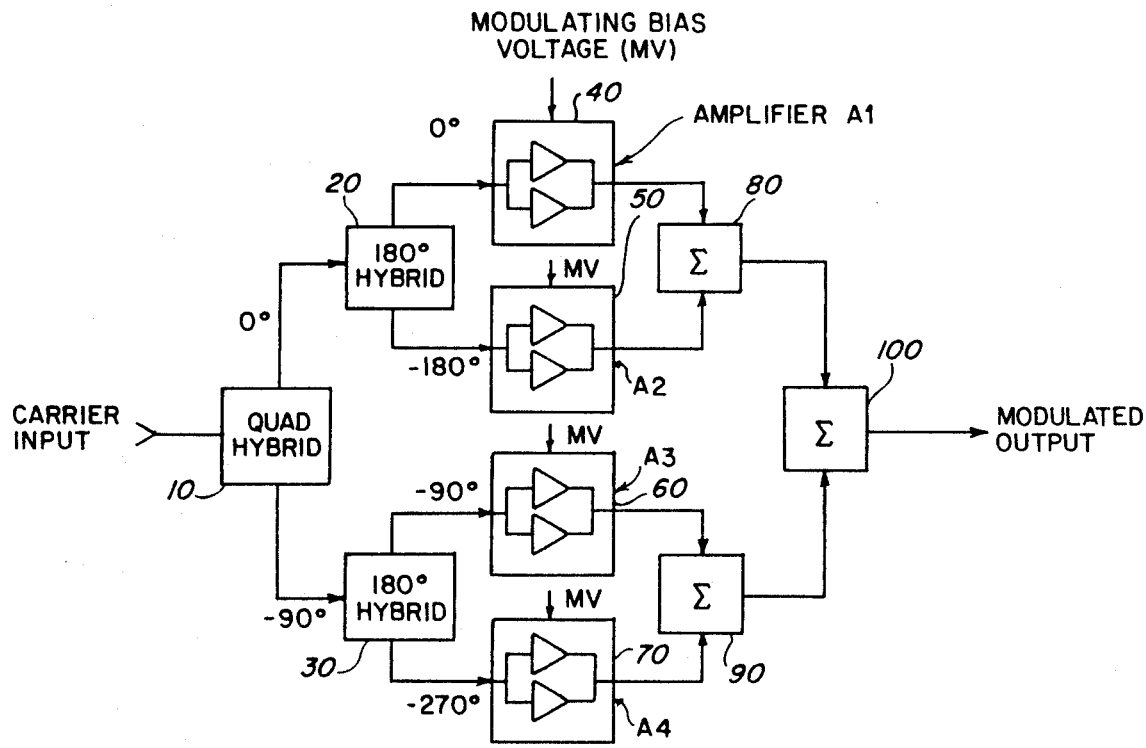
FIG. 4 is a schematic of the active phase and amplitude modulator.

FIG. 4 is a schematic diagram of the invention. An input signal, also referred to as the carrier, enters at quad hybrid 10. This hybrid splits the signal +to 0 degrees and −90 degree phases. The 0 degree phase is sent into hybrid 20. This yields phases of 0 degrees and −180 degrees. The −90 degree signal output from hybrid 10 is sent to hybrid 30. This yields −90 and −270 degree signals. Thus, four signals of 0, −90, −180, and −270 degrees have been generated and are available to amplifiers 40, 50, 60, and 70. These amplifiers are also supplied with modulating voltages which control the instantaneous amplitude of the output of each amplifier. The outputs of amplifiers 40 and 50 are summed by summing circuit 80 and the output of amplifiers 60 and 70 are summed by summing circuit 90. The sums generated by 80 and 90 are, in turn, summed by summing circuit 100.

The summing circuits 80, 90, and 100 may be 180 degree hybrids or, in low power applications, operational amplifier summers.

This device achieves the blending of phases in varying proportions by varying the modulating voltages applied to the said amplifiers. This is in contrast to the standard method wherein phase proportion variance is achieved by unbalancing hybrids with a varying resistance attached to nodes of the hybrids, and wherein the varying resistance is a noisy diode-resistor network.

In the preferred embodiment of this device, amplifiers 40, 50, 60, and 70 comprise a push-pull pair of field effect transistors. The configuration results in cancellation of even order harmonics and other forms of distortion which arise in the modulating process.

The use of transistor amplifiers in the modulator, rather than passive hybrids, also allow higher power signals to be produced. The modulator can modulate a carrier with a power level of −6 dbW, with distortion products at a level of −60 dbW. This level, at HF frequencies, is higher than that available with reflective hybrid type modulators.

Of course, any other form of active network that is capable of being appropriately modulated could serve in place of the said amplifiers. For example, bipolar transistors or vacuum tubes could be used. Furthermore, if cancellation of even order distortion products is not essential, a push-pull amplifier need not be used.

The embodiment described above is meant for puspose of illustration and example only, and not as a limitation upon the scope of the following claims.

What is claimed is:

1. A phase and amplitude modulator comprising:
   means for generating a plurality of phases from an input signal;
   means for separately amplifying each of the generated phases, which means may be modulated to change the amplitude output of each phase in response to a modulating signal, wherein said means for amplifying comprises field effect transistors in push-pull configuration; and,
   means for summing the output of the said amplifying means such that a single output signal of modified phase and amplitude is obtained.

2. A phase and amplitude modulator comprising:
   means for generating a plurality of phases from an input signal comprising a first hybrid for generating from an input carrier a first phase and a second phase, comprising at least two outputs, one for each of said phases; a second hybrid with an input connected to one of said outputs of the said first hybrid; and a third hybrid with an input connected to the other output of the said first hybrid; wherein the said second hybrid outputs signals of the said first phase and a third phase, and wherein said third hybrid outputs signals of said second phase and a fourth phase; and wherein the said phases differ from one another sufficiently such that two of said phases may be combined to produce a resultant signal with any given phase relative to that of the said input carrier;
   means for separately amplifying each of said phases, at least four in number, comprising field effect transistors in push-pull configuration;
   means for applying a separate modulating voltage to each of said amplifying means; and
   means for summing the output of said amplifying means comprising at least a first, second, and third 180 degree hybrids, wherein inputs of said first hybrid are connected to the outputs of at least two of the said amplifying means and wherein inputs of said second hybrid are connected to at least the outputs of two other of said amplifying means; and wherein the outputs of said first and second hybrids are, in turn, summed in the third hybrid.

* * * * *